United States Patent
Chen et al.

(10) Patent No.: US 8,800,371 B2
(45) Date of Patent: Aug. 12, 2014

(54) ELECTROSTATIC FORCE GENERATOR AND FORCE MEASUREMENT SYSTEM AND ACCELEROMETER HAVING THE SAME

(75) Inventors: Sheng Jui Chen, Taoyuan County (TW); Hsiao Hsi Pan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 275 days.

(21) Appl. No.: 13/415,526

(22) Filed: Mar. 8, 2012

(65) Prior Publication Data

US 2013/0233077 A1    Sep. 12, 2013

(51) Int. Cl.
*G01P 15/18* (2013.01)
*G01P 15/13* (2006.01)
*G01P 15/125* (2006.01)

(52) U.S. Cl.
CPC .............. *G01P 15/131* (2013.01); *G01P 15/18* (2013.01)
USPC ..................................... 73/514.18; 73/514.32

(58) Field of Classification Search
CPC ....... G01P 15/131; G01P 15/18; G01P 15/11; G01P 15/125; G01P 1/006; G01L 1/08; G01L 1/086; G01L 11/008
USPC .............. 73/514.17, 514.18, 514.32, 862.61, 73/862.626, 862.381, 862.391, 862.451, 73/862.621
See application file for complete search history.

(56) References Cited

U.S. PATENT DOCUMENTS

| | | | |
|---|---|---|---|
| 3,911,738 A * | 10/1975 | Fischer ...................... | 73/514.18 |
| 4,059,797 A * | 11/1977 | Gay ............................. | 324/680 |
| 4,583,404 A * | 4/1986 | Bernard et al. ............ | 73/514.18 |
| 4,688,141 A | 8/1987 | Bernard et al. | |
| 4,799,386 A * | 1/1989 | Bernard et al. ............ | 73/514.18 |
| 4,987,779 A * | 1/1991 | McBrien .................... | 73/514.18 |
| 5,412,988 A * | 5/1995 | Neff et al. .................. | 73/514.16 |
| 5,440,939 A * | 8/1995 | Barny et al. ................ | 73/862.61 |
| 5,576,483 A | 11/1996 | Bonin | |
| 5,894,090 A * | 4/1999 | Tang et al. .................. | 73/504.02 |
| 6,805,008 B2 * | 10/2004 | Selvakumar et al. ...... | 73/504.14 |
| 7,275,433 B2 * | 10/2007 | Caminada et al. ......... | 73/514.18 |
| 7,347,096 B2 * | 3/2008 | Vrcelj ......................... | 73/514.17 |
| 7,681,432 B2 | 3/2010 | Hay et al. | |
| 8,322,216 B2 * | 12/2012 | Yu et al. ..................... | 73/514.32 |

OTHER PUBLICATIONS

Sheng-Jui Chen and Sheau-Shi Pan, "A force measurement system based on an electrostatic sensing and actuating technique for calibrating force in a micronewton range with a resolution of nanonewton scale," IOP Publishing, Meas. Sci. Technol. 22 (2011) 045104 (8pp), IP Address: 140.96.62.217, pp. 1-8, Mar. 15, 2011.

(Continued)

*Primary Examiner* — Helen Kwok
(74) *Attorney, Agent, or Firm* — WPAT, P.C.; Anthony King; Kay Yang

(57) ABSTRACT

An electrostatic force generator is disclosed. The electrostatic force generator includes an RF AC voltage source, a capacitive module, a resonant capacitive-inductive bridge (CIB) module, a lock-in amplifier module, and a proportional-integral-derivative (PID) controller. The resonant capacitive-inductive bridge module converts the differential capacitance to a differential signal. The differential signal from the resonant capacitive-inductive bridge module is demodulated at the RF excitation frequency by the lock-in amplifier module. The PID controller receives the output signal from the lock-in amplifier module and generates two audio frequency AC signals to generate a compensation electrostatic force and maintain the capacitance balance inside the capacitive module.

25 Claims, 8 Drawing Sheets

(56) References Cited

OTHER PUBLICATIONS

V. Josselin, P. Touboul, and R. Kielbasa, "Capacitive detection scheme for space accelerometers applications," Sensors and Actuators, vol. 78, pp. 92-98, 1999.

S. E. Pollack, S. Schlamminger, and J. H. Gundlach, "Temporal Extent of Surface Potentials between Closely Spaced Metals," Physical Review Letters, vol. 101, No. 071101, pp. 1-4, Aug. 2008.

Vladimir Nesterov, "Facility and methods for the measurement of micro and nano forces in the range below 10-5 N with a resolution of 10-12 N (development concept)," Measurement Science and Technology, vol. 18, pp. 360-366, Jan. 2007.

Jon R Pratt, John A Kramar, David B Newell and Douglas T Smith, "Review of SI traceable force metrology for instrumented indentation and atomic force microscopy," Measurement Science and Technology, vol. 16, pp. 2129-2137, Sep. 2005.

\* cited by examiner

ELECTROSTATIC FORCE GENERATOR AND FORCE MEASUREMENT SYSTEM AND ACCELEROMETER HAVING THE SAME

TECHNICAL FIELD

The disclosure relates to an electrostatic force generator, and a force measurement system and an accelerometer having the same.

BACKGROUND

With the rapid advancement of nanotechnology, techniques for generation and measurement of micro/nanonewton forces are widely applied in various fields of science and industry. In biotechnology, an atomic force microscope (AFM) is used to measure the interaction forces between biological molecules. In material science, an instrumented indentation system is used for determining the elastic modulus and hardness of material. In fundamental science, Casimir force is measured by the AFM with piconewton resolution. Although measurements of forces at nano/piconewton scale are ordinary among these applications, the lowest "International System of Units" (SI) traceable force standard provided by the National Metrology Institutes (NMIs) is only a few micronewtons. To meet the need for a traceable force measurement at micro/nano/piconewton level, several NMIs have developed new force standard systems for SI traceable force realization at micro/nanonewton level. The NIST Microforce Project has developed an electrostatic force balance (EFB), and demonstrated SI force realization of forces below 5 micronewtons (A) with a resolution of a few nanonewtons (nN). The force is electrostatic and linked to electrical unit standards and the Josephson and quantized Hall effects. KRISS has established a nano-force calibrator based on a precision microbalance, which is designed for the calibration of the spring constant of the AFM cantilever. In addition, KRISS is also developing a controllable, piconewton-range ultra-low-force realization based on a macroscopic quantum phenomenon: magnetic flux quantization in a superconducting annulus. The PTB group has constructed a new nanonewton-force standard facility for measuring forces below 10 μN with a piconewton-scale resolution. The NPL group has developed a low force balance in which the force is electrostatic and realized by a dielectric and two metal electrodes. In the Center for Measurement Standards (CMS), Industrial Technology Research Institute (ITRI), a torsion pendulum facility is built for measuring forces below 20 nN with a piconewton-scale resolution. The apparatus is capable of comparing forces produced from three methods, namely the radiation pressure force, the electrostatic force and the gravitational force.

SUMMARY

For larger forces at the micronewton level, a new force measurement system has been developed based on a flexure stage with capacitive position sensing and electrostatic force actuation. The present disclosure presents the design and development of an electrostatic force generator and force measurement system having the same.

The present disclosure provides an electrostatic force generator which operates on force-balance principle. The electrostatic force generator includes a capacitive module, a differential transformer, and a proportional-integral-derivative (PID) controller. The capacitive module consists of three electrodes in which a first capacitor and a second capacitor are formed. The differential transformer detects a differential signal in response to a capacitive difference resulted from external forces applied on the capacitive module. The differential signal is proportional to the capacitive difference between the first capacitor and the second capacitor. The PID controller is in response to the differential signal to generate a control signal. The PID controller applies two AC signals to the corresponding electrodes of the first capacitor and the second capacitor to generate an electrostatic force to balance the external forces and thus compensate the capacitive difference between the first capacitor and the second capacitor.

The present disclosure provides a force measurement system comprising the above-mentioned electrostatic force generator, a monolithic flexure stage and a base. The capacitive module includes a first electrode, a second electrode, and a third electrode, which is disposed between the first electrode and the second electrode. The third electrode is attached to the monolithic flexure stage. The base holds the capacitive module, including a metal housing and insulation plates. The metal housing accommodates the first electrode, the second electrode, the third electrode and the insulation plates. The first electrode and second electrode are disposed on the insulation plates.

The present disclosure also provides an accelerometer. The accelerometer includes the above-mentioned electrostatic force generator, a mechanical spring, and a housing. The capacitive module includes a first electrode, a second electrode, and a third electrode, which is disposed between the first electrode and the second electrode. The housing has a top wall, a first lateral wall and a second lateral wall. The third electrode is attached to the mechanical spring which is connected to the top wall. The first electrode is attached to the first lateral wall. The second electrode is attached to the second lateral wall.

The present disclosure provides an electrostatic force generator. The electrostatic force generator includes a radio frequency (RF) AC voltage source generating an RF excitation signal, a capacitive module connected with a resonant capacitive-inductive bridge module (resonant CIB module) receiving the RF excitation signal, a lock-in amplifier module and a proportional-integral-derivative (PID) controller. The resonant capacitive-inductive bridge module includes variable capacitors and a differential transformer which has two primary windings and one secondary winding. The turns ratio between the two primary windings of the differential transformer is one. The turns ratio from the secondary winding to one of the primary windings is equal to or greater than one. The lock-in amplifier module receives a differential signal output from the secondary winding of the differential transformer. The differential signal is demodulated at the RF excitation frequency by the lock-in amplifier module to generate an output signal $V_x$ acquired by the PID controller. Consequently, the PID controller generates a first AC signal and a second AC signal, wherein the first AC signal is conducted to the capacitive module through a first loop of the resonant CIB module and the second AC signal is conducted to the capacitive module through a second loop of the resonant CIB module.

The foregoing has outlined rather broadly the features and technical benefits of the disclosure in order that the detailed description of the invention that follows may be better understood. Additional features and benefits of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the disclosure. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION

In the following description, numerous specific details are set forth. However, it should be understood that embodiments of the disclosure may be practiced without these specific details. In other instances, well-known methods, structures and techniques have not been shown in detail in order not to obscure an understanding of this description. References to "one embodiment," "an embodiment," "another embodiment," "other embodiment," etc. indicate that the embodiment(s) of the disclosure so described may include feature, structure, or characteristic, but not every embodiment necessarily includes all of the feature, structure, or characteristic. Further, repeated use of the phrase "in the embodiment" does not necessarily refer to the same embodiment, although it may.

The present disclosure is directed to an electrostatic force generator and a force measurement system and an accelerometer having the same. In order to make the present disclosure completely comprehensible, detailed steps and structures are provided in the following description. Implementation of the present disclosure does not limit special details known by persons skilled in the art. In addition, known structures and steps may be not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
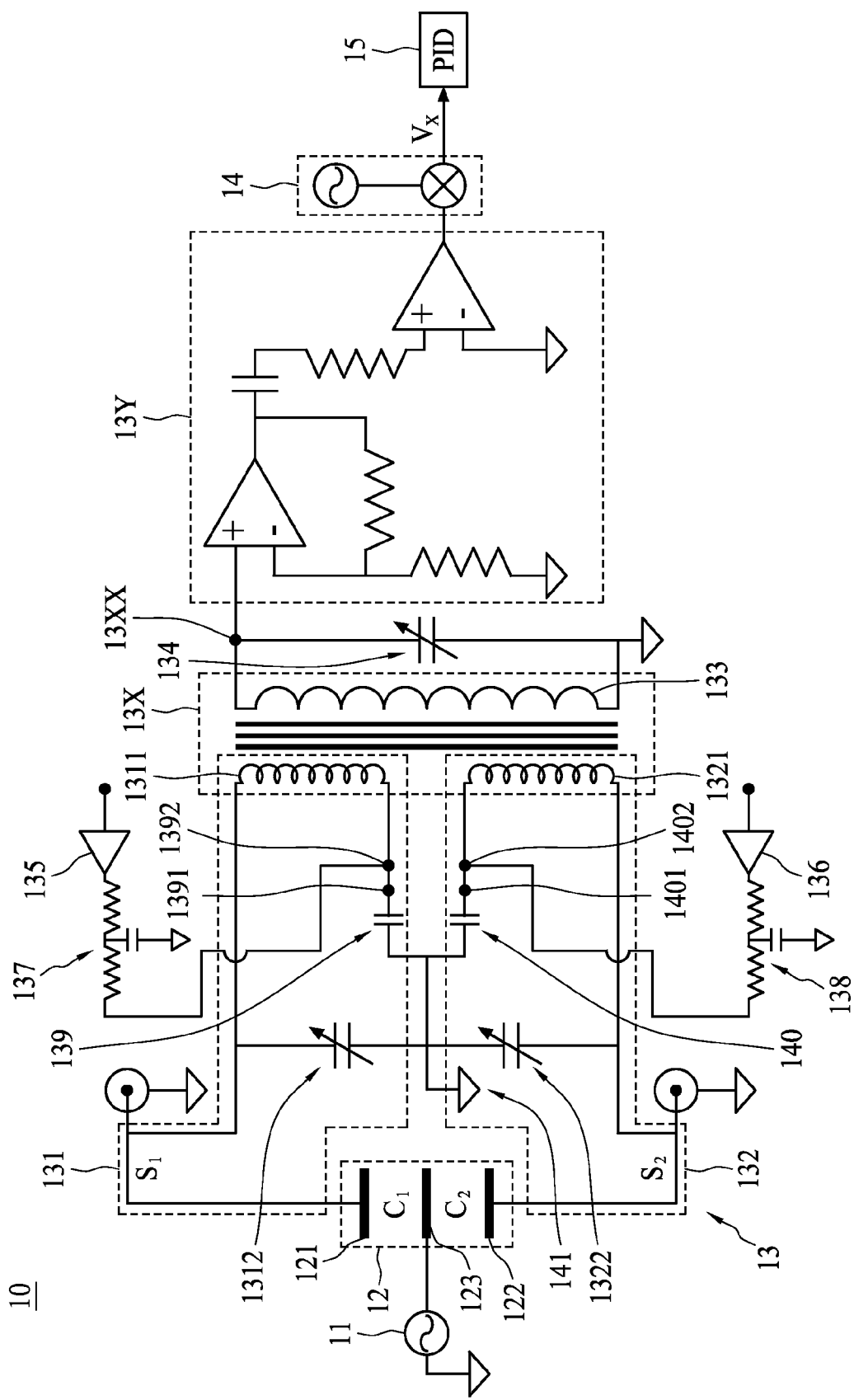
FIG. 1 is a circuit diagram of an electrostatic force generator in accordance with one embodiment of the present disclosure.

FIG. 1 is a circuit diagram of an electrostatic force generator 10 in accordance with one embodiment of the present disclosure. Referring to FIG. 1, the electrostatic force generator 10 includes a radio frequency (RF) alternating current (AC) voltage source 11, a capacitive module 12, a resonant capacitive-inductive bridge (CIB) module 13, a lock-in amplifier module 14, and a proportional-integral-derivative (PID) controller 15. The resonant capacitive-inductive bridge module 13 includes a differential transformer 13X.

The RF AC voltage source 11, which may include one of an integrated circuit (IC) or a module, generates an RF excitation signal at a frequency ranging from approximately 50 kilohertz (kHz) to approximately 200 kHz, for example, 100 kHz.

The capacitive module 12 includes a first electrode 121, a second electrode 122, and a third electrode 123 between the first electrode 121 and the second electrode 122. The RF excitation signal from the RF AC voltage source 11 is applied to the third electrode 123 so that, due to capacitive function, resulting in the first sensing signal ($S_1$) at the first electrode 121 and the second sensing signal ($S_2$) at the second electrode 122. In other words, the capacitive module 12 is configured to divide the RF excitation signal into the first sensing signal ($S_1$) and the second sensing signal ($S_2$). The first electrode 121 and the third electrode 123 define a first capacitor $C_1$; meanwhile, the second electrode 122 and the third electrode 123 define a second capacitor $C_2$.

The resonant capacitive-inductive bridge module 13 includes a first loop 131 (schematically shown in a dashed border), a second loop 132 (schematically shown in another dashed border), a differential transformer 13X and an amplification stage 13Y. The first loop 131 is electrically connected to the first electrode 121, while the second loop 132 is electrically connected to the second electrode 122. Thus, the $S_1$ signal is conducted by the first loop 131, while the $S_2$ signal is conducted by the second loop 132. In the embodiment, the resonant capacitive-inductive bridge module 13 includes a first winding 1311 in the first loop 131, a second winding 1321 in the second loop 132, and a third winding 133. The RF differential transformer 13X has two primary windings 1311, 1321 and one secondary winding 133. In one embodiment, the turns ratio between two primary windings 1311 and 1321 is one. Furthermore, the turns ratio from the secondary winding 133 to one of the primary windings of 1311 or 1321 is equal to or greater than one. When $C_1=C_2$, the magnitude of the signal $S_1$ is equal to that of the signal $S_2$, the AC magnetic flux induced by the signal $S_1$ is neutralized with that induced by the signal $S_2$, hence the net AC magnetic flux developed inside the RF differential transformer 13X is null and no corresponding differential signal is presented at the output node 13XX (of the differential transformer 13X). When $C_1 \neq C_2$, a non-zero net AC magnetic flux is developed inside the differential transformer 13X and a non-zero differential signal is presented at the output node 13XX (of the differential transformer 13X).

Moreover, the resonant capacitive-inductive bridge module 13 further includes a first variable capacitor 1312 in the first loop 131 and a second variable capacitor 1322 in the second loop 132. The first variable capacitor 1312 adjusts the total capacitance in the first loop 131, which is equal to the parallel combination of capacitance $C_1$, capacitor 139, capacitance between electrode 121 and its metal housing, capacitance of coaxial cable used to connect the electrode 121 to the resonant capacitive-inductive module 13 and other parasitic capacitances presented in the circuit. The second variable capacitor 1321 adjusts the total capacitance in the second loop 132. The total capacitances of the first loop 131 and the second loop 132 can be made equal by adjusting the variable capacitors 1312 and 1322. Another variable capacitor 134 is connected to the secondary winding 133 in parallel. The variable capacitor 134 is used to set the resonant frequency of the resonant capacitive-inductive bridge module to be equal to the RF excitation frequency, so as to increase the detection sensitivity of the differential capacitance signal.

In the present embodiment, a first capacitor $C_1$ is formed between the third electrode 123 and the first electrode 121, while a second capacitor $C_2$ is formed between the third electrode 123 and the second electrode 122. When the gaps among the third electrode 123, the first electrode 121 and the second electrode 122 vary, the capacitances of the capacitors $C_1$ and $C_2$ vary as well, resulting in a difference in the capacitance values, which is expressed as $\Delta C=C_1-C_2$. The differential capacitance $\Delta C$ is detected by the resonant capacitive-inductive bridge module 13.

The differential signal from the node 13XX is amplified by the amplification stage 13Y, and then sent to the lock-in amplifier module 14. The lock-in amplifier module 14 demodulates the differential signal at the RF excitation frequency and generates an output signal $V_x$ that is proportional to the differential capacitance $\Delta C$.

Figure 5:
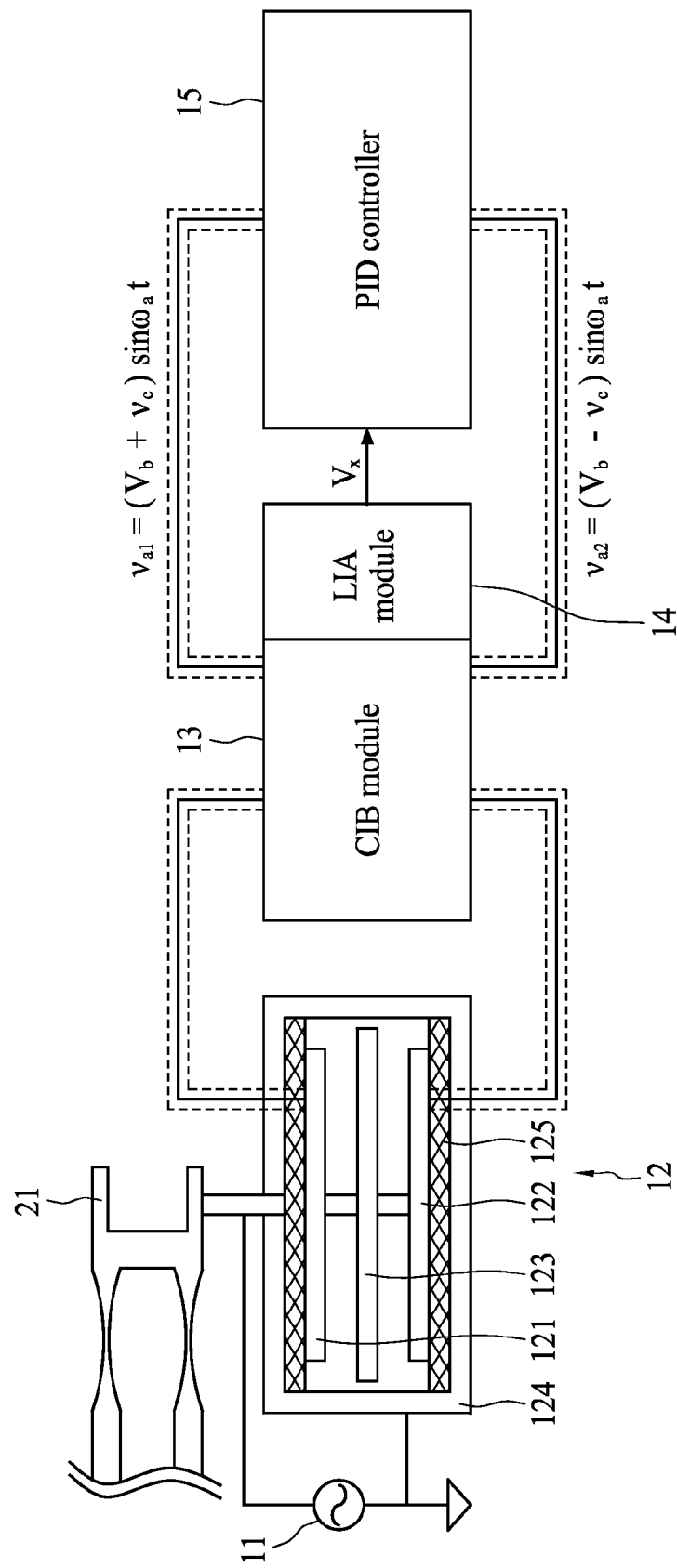
FIG. 5 is a schematic view illustrating operation of the force measurement system illustrated in FIG. 2 in accordance with one embodiment of the present disclosure.

The proportional-integral-derivative (PID) controller 15 acquires the output signal $V_x$, and generates a control signal $v_c$ according to PID parameters and further uses this control signal to synthesize a first AC signal $v_{a1}$ (shown in FIG. 5) and a second AC signal $v_{a2}$ (shown in FIG. 5). The first AC signal $v_{a1}$ and the second AC signal $v_{a2}$ are defined in equations below:

$$v_{a1}=(V_b+v_c)\sin \omega_a t; \text{ and}$$

$$v_{a2}=(V_b-v_c)\sin \omega_a t,$$

wherein $\omega_a=2\pi(f_a)$, which is an angular frequency, $f_a$ is the actuation frequency ranging from approximately 100 Hz to 2 kHz, and $V_b$ is a constant ranging from approximately 0.94 V to 2.98 V, depending on the upper force limit of the measurement range and the gain of the high voltage amplifiers 135, 136 used to produce high voltage AC signals.

Since the actuation frequency $f_a$ ranges from approximately 100 Hz to 2 kHz, the AC signals will not interfere with the RF excitation signal at 100 kHz from the RF AC voltage source 11 for differential capacitance sensing.

The resonant CIB module 13 may further include a first amplifier 135 and a second amplifier 136. The first AC signal $v_{a1}$ and the second AC signal $v_{a2}$ are conducted into the resonant CIB module 13 through the first amplifier 135 and the second amplifier 136, respectively. Thus, the first AC signal $v_{a1}$ is amplified through the first amplifier 135, while the second AC signal $v_{a2}$ is amplified through the second amplifier 136. In one embodiment, the first amplifier 135 and the second amplifier 136 are high-voltage amplifiers.

The resonant CIB module 13 may further include a first low-pass filter 137 and a second low-pass filter 138. The first low-pass filter 137 is electrically connected between the first amplifier 135 and the first winding 1311. The second low-pass filter 138 is electrically connected between the second amplifier 136 and the second winding 1321. Moreover, the capacitive inductive bridge module 13 further includes a third capacitor 139 in the first loop 131, and a fourth capacitor 140 in the second loop 132. In addition, the first loop 131 and the second loop 132 are grounded at a grounding point 141.

The third capacitor 139 and the fourth capacitor 140 facilitate the first AC signal ($v_{a1}$) and the second AC signal ($v_{a2}$) to be conducted to the first electrode 121 and the second electrode 122, respectively. Specifically, the first AC signal ($v_{a1}$) is conducted to the electrode 121 of the capacitive module 12 through the first loop 131, while the second AC signal ($v_{a2}$) is conducted to the electrode 122 of the capacitive module 12 through the second loop 132. Both the first AC signal ($v_{a1}$) and the second AC signal ($v_{a2}$) function to generate an electrostatic force to the electrode 123 to maintain the condition of $C_1=C_2$.

Figure 2:
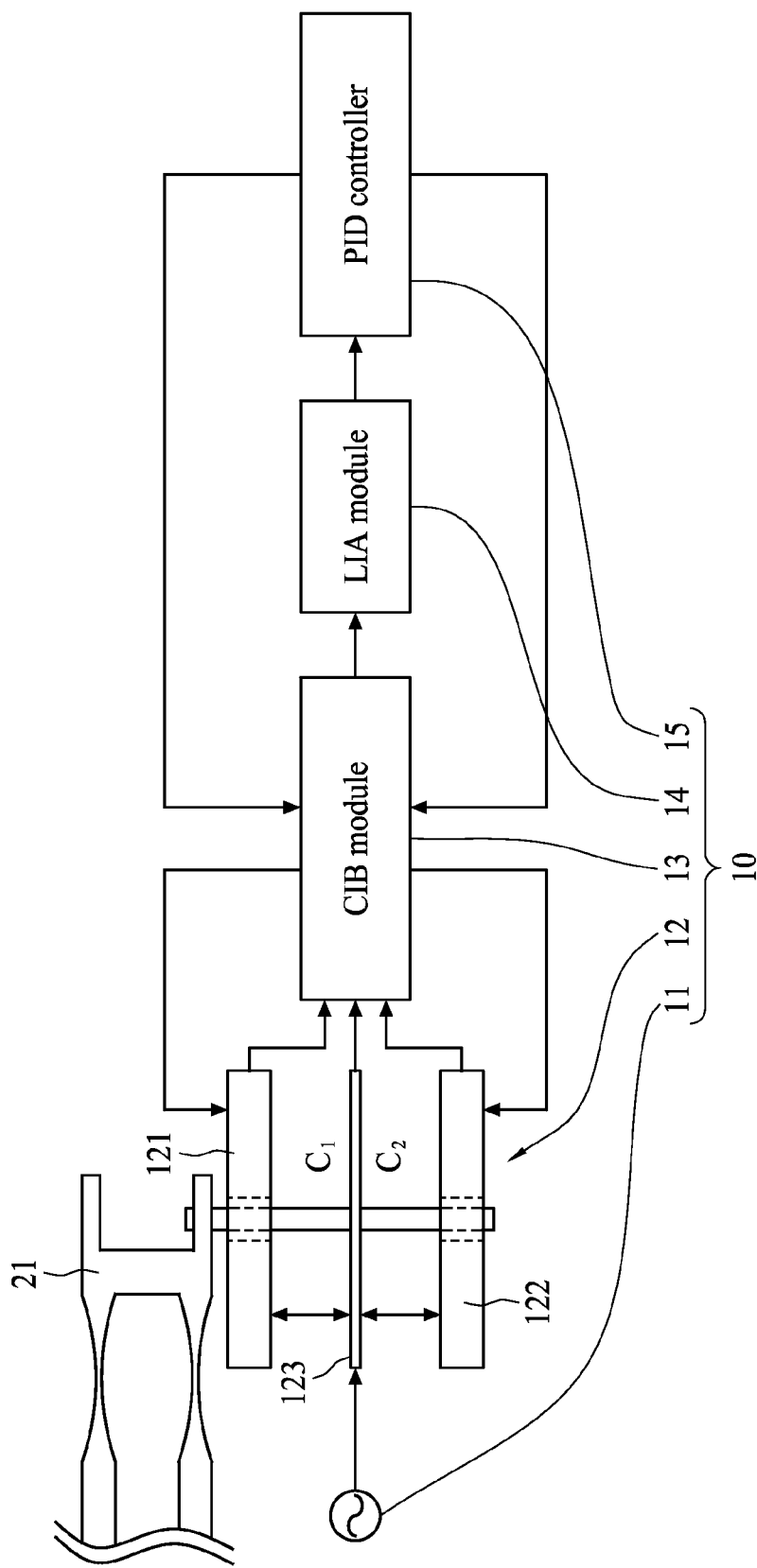
FIG. 2 is a schematic view of a force measurement system including the electrostatic force generator illustrated in FIG. 1 in accordance with one embodiment of the present disclosure.
Figure 3:
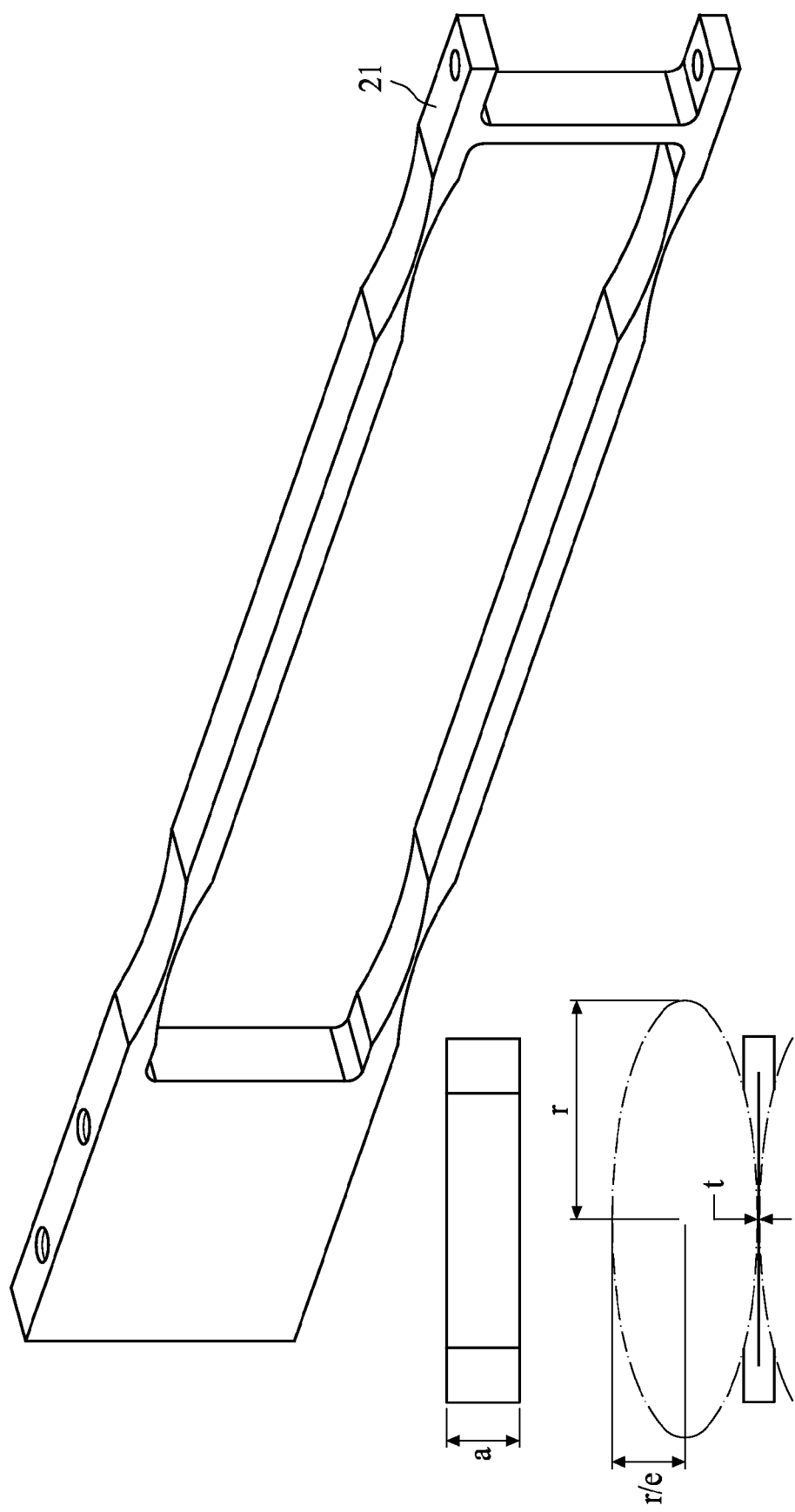
FIG. 3 is a perspective view of a monolithic flexure stage in accordance with one embodiment of the present disclosure.
Figure 4:
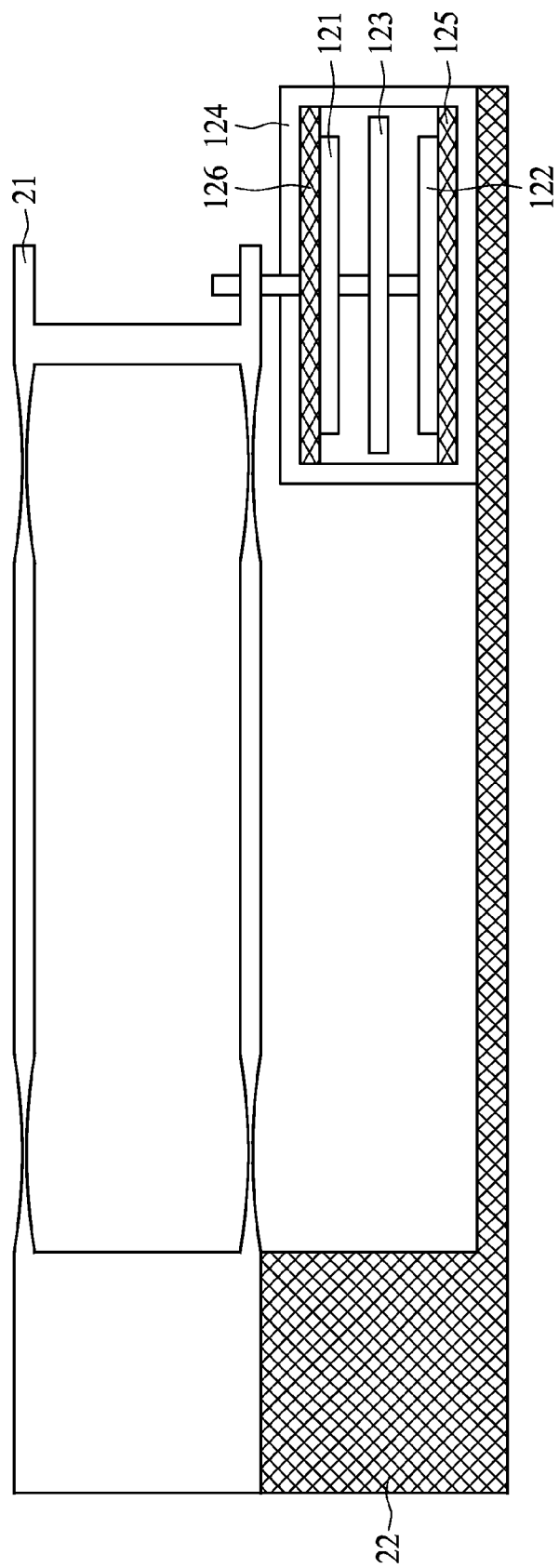
FIG. 4 is an enlarged view, in part, of the force measurement system illustrated in FIG. 2.

Referring to FIGS. 2 to 4, the present disclosure provides a force measurement system 20 that includes the above-mentioned electrostatic force generator 10, a monolithic flexure stage 21 and a base 22.

FIG. 3 shows a perspective view of a monolithic flexure stage 21 in accordance with one embodiment of the present disclosure. The design parameters of the monolithic flexure stage 21, including the width "a", the thickness "t" at the thinnest portion, the radius "r" and the ratio "e" of the semi-major to the semi-minor axes of ellipse, are also shown in the inset of FIG. 3.

The RF AC voltage source 11 generates an RF excitation signal conducted to the third electrode 123. Referring back to FIG. 2, since the third electrode 123 is attached to the monolithic flexure stage 21, the capacitor $C_1$ and the capacitor $C_2$ change in capacitance when the monolithic flexure stage 21 deflects. The position sensing is performed at a relatively high radio frequency such as 100 kHz and the electrostatic force actuation is performed at an audio frequency, for example, 490 Hz. The electrodes 121, 122 and 123 may be machined out from the aluminum alloy, for example, Al 6061-T6, with surface lapping applied to the active surfaces thereof. The deflection is detected by the resonant capacitive-inductive bridge module 13. A schematic view of differential capacitance sensing and electrostatic actuating is shown in FIG. 2. Two capacitors $C_1$ and $C_2$ are defined by the three electrodes 121, 122 and 123. The middle electrode 123 is attached to and moves with the monolithic flexure stage 21. When the middle electrode 123 is disposed at an equilibrium position, the capacitance values of $C_1$ and $C_2$ are equal. When the monolithic flexure stage 21 deflects, the distances between the electrodes 121 and 123 and the electrodes 122 and 123 vary, which result in the variation of the capacitance values.

Referring to FIG. 4, a base 22 holds the capacitive module 12. The capacitive module 12 may further include a metal housing 124 and an insulation plate 125. The metal housing 124 accommodates the first electrode 121, the second electrode 122, the third electrode 123 and the insulation plate 125 and is grounded as shown in FIG. 5. The second electrode 122 is disposed on the insulation plate 125. Furthermore, the capacitive module 12 may include an upper insulation plate 126 to which the first electrode 121 is attached.

Figure 6:
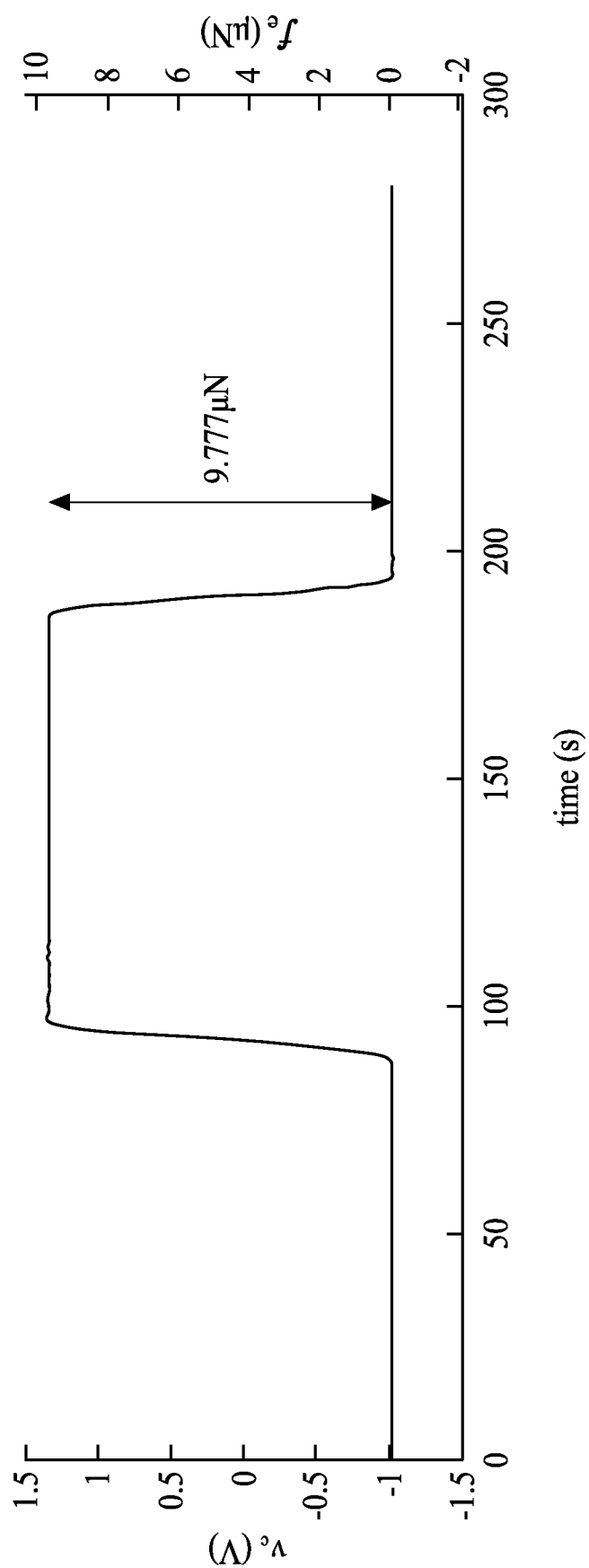
FIG. 6 is a diagram showing force measurement in a curve in accordance with one embodiment of the present disclosure.
Figure 7:
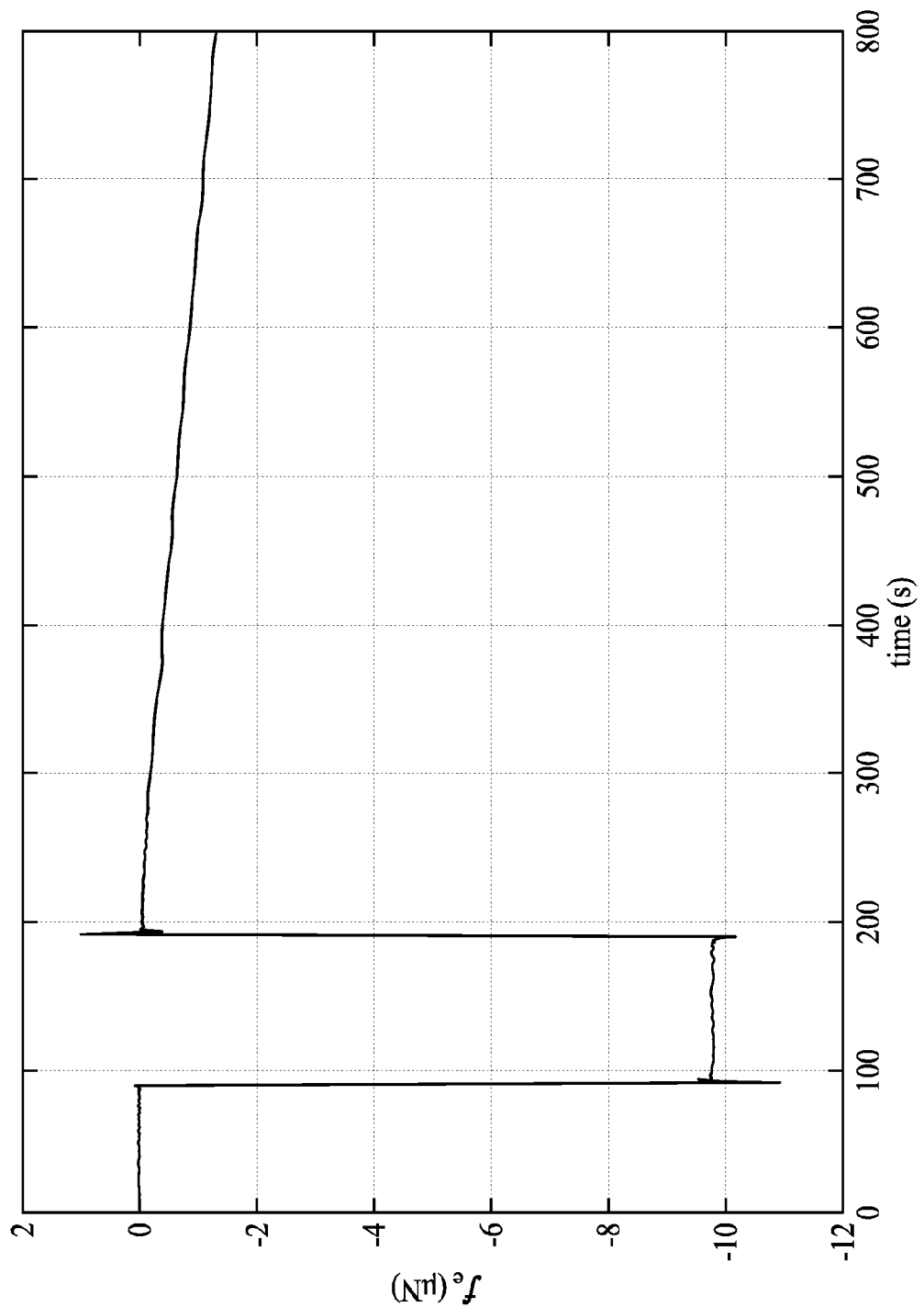
FIG. 7 is a diagram showing force measurement in a curve in accordance with another embodiment of the present disclosure.

Referring to FIG. 5, the PID controller 15 outputs the first AC signal $v_{a1}=(V_b+v_c) \sin \omega_a t$ and the second AC signal $v_{a2}=(V_b-v_c) \sin \omega_a t$ to the resonant CIB module 13. The audio frequency, AC voltage actuation scheme is capable of reducing electrostatic force noise induced from the surface potentials of the electrodes. In contrast to the AC voltage actuation scheme, the DC voltage actuation scheme couples the surface potentials of the electrode with the actuation voltage, which leads to an amplification of the surface potential effect. In addition to this drawback, DC voltage actuation scheme also creates charging effects which further intensifies the drift in electrostatic force. Both FIG. 6 and FIG. 7 show the measurement process of the force measurement system generating an electrostatic force to balance the deadweight force from a weight of 1 mg. In FIG. 6, AC voltage actuation scheme is used and no apparent drift in electrostatic force is observed. While in FIG. 7, DC actuation scheme is used and severe drift in electrostatic force is shown. In the embodiment shown in FIG. 5, the first AC signal $v_{a1}$ and the second AC signal $v_{a2}$ may be respectively applied to the first electrode 121 and the second electrode 122 for actuating the third electrode 123 so that the third electrode may be maintained at its original position, i.e. the force balance condition. The electrostatic force $f_e$ generated by the AC signals as shown in FIG. 5 may be calculated as follows:

$$f_e = kV_b v_c,$$

where k is a constant determined by the dimensions of and the gap distance between electrodes. The constant k can be obtained by applying a known force to the force measurement system and calculated using the values of constant $V_b$ and the automatically generated control voltage $v_c$.

Figure 8:
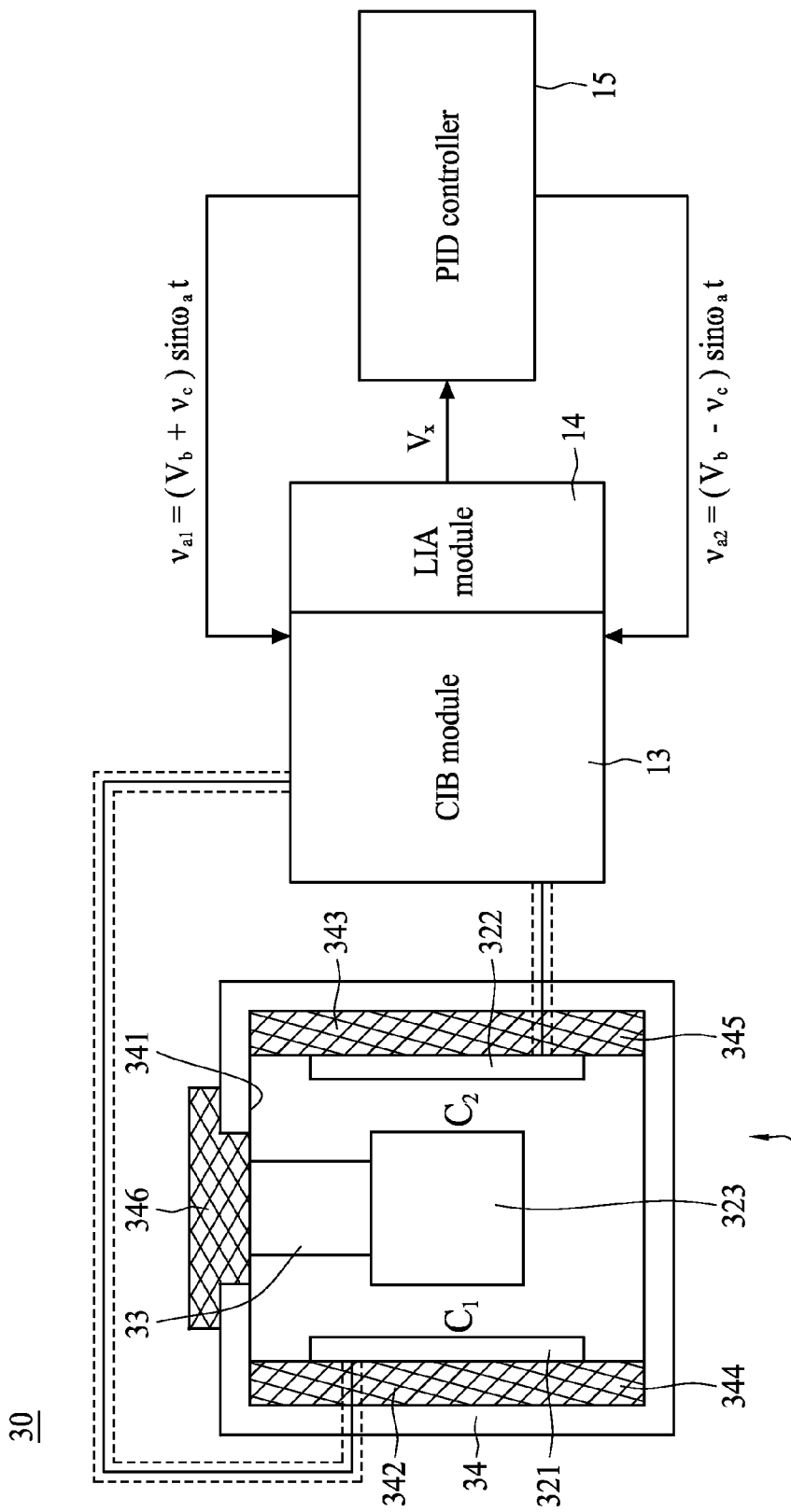
FIG. 8 is a schematic view of an accelerometer in accordance with one embodiment of the present disclosure.

Referring to FIG. 8, the present disclosure in another embodiment provides an accelerometer 30 that includes the above-mentioned electrostatic force generator 10, a mechanical spring 33 and a housing 34. The capacitive module 32 includes a first electrode 321, a second electrode 322 and a third electrode 323. The third electrode 323 is disposed between the first electrode 321 and the second electrode 322. An RF AC voltage source (not shown) generates an RF excitation signals conducted into the third electrode 323. The housing 34 has a top wall 341, a first lateral wall 342, and a second lateral wall 343 and accommodates the mechanical spring 33 (e.g. a flexure spring), the first electrode 321, the second electrode 322 and the third electrode 323. The third electrode 323 is attached to the mechanical spring 33 which connected to the top wall 341 via the insulation plate 346. Thus, the third electrode 323 indirectly connects to the top wall 341 through the mechanical spring 33. Moreover, the first electrode 321 is attached to the first lateral wall 342, while the second electrode 322 is attached to the second lateral wall 343. Three insulation plates 344, 345 and 346 are accommodated in the housing 34. Since the first insulation plate 344 is directly attached to the first lateral wall 342, the first electrode 321 disposed on the first insulation plate 344 is electrically insulated from the first lateral wall 342. Similarly, since the second insulation plate 345 is directly attached to the second lateral wall 343, the second electrode 322 disposed on the second insulation plate 345 is electrically insulated from the second lateral wall 343. The third insulation plate 346 is disposed in the top wall 341. Since the mechanical spring 33 connects to the third insulation plate 346, the mechanical spring 33 is not electrically connected to the housing 34.

In the embodiment shown in FIG. 8, if the third electrode 323 has a mass "m", the acceleration "a" of the accelerometer 30 is measured by an equation below:

$$a = \frac{f_e}{m} = \frac{kV_b}{m} v_c.$$

The force measurement system includes a monolithic flexure stage and three sensing/actuating electrodes for capacitive position sensing and electrostatic actuation. The monolithic flexure stage serves as the mechanical spring for converting the force to be measured (the external force) to its own deflection. The deflection of the stage is detected by the capacitive position sensing method and compensated by electrostatic force $f_e$. The middle electrode is attached to the stage and two other electrodes are mounted on a fixed reference frame. In one embodiment, the PID controller further uses the control signal to synthesize two alternative current (AC) signals. By measuring the difference between two capacitance values formed among the three electrodes, the deflection of the stage can be detected. In electrostatic force compensation, a feedback control loop monitors and nulls this deflection by applying a counteracting electrostatic force to the stage.

The above-described embodiments of the present disclosure are intended to be illustrative only. Numerous alternative embodiments may be devised by persons skilled in the art without departing from the scope of the following claims. Those skilled in the art may devise numerous alternative embodiments without departing from the scope of the following claims.

What is claimed is:

1. An electrostatic force generator, comprising:
   a capacitive module including a first capacitor and a second capacitor;
   a differential transformer configured to generate a differential signal in response to a capacitive difference between the first capacitor and the second capacitor;
   a proportional-integral-derivative (PID) controller configured to generate a first alternative current (AC) signal in response to the differential signal, and to apply the first AC signal to the first capacitor to generate an electrostatic force for achieving a capacitive balance between the first capacitor and the second capacitor;
   a resonant capacitive-inductive bridge module including a first loop, a second loop, a first variable capacitor and a second variable capacitor, wherein the differential transformer includes two primary windings and a secondary winding, the two primary windings are in the first loop and the second loop, respectively; the first variable capacitor is configured to adjust a total capacitance in the first loop, and the second variable capacitor is configured to adjust a total capacitance in the second loop;
   a lock-in amplifier module configured to generate an output signal $V_x$ in response to the differential signal, wherein the differential signal is demodulated at a RF excitation frequency; and
   a third variable capacitor configured to set a resonant frequency of the resonant capacitive-inductive bridge module to be equal to the RF excitation frequency.

2. The electrostatic force generator of claim 1, further comprising an RF alternative current (AC) voltage source configured to couple with the capacitive module for generating an RF excitation signal.

3. The electrostatic force generator of claim 2, wherein the capacitive module is configured to divide the RF excitation signal into a first sensing signal and a second sensing signal.

4. The electrostatic force generator of claim 3, wherein the differential transformer is configured to generate the differential signal in response to the first sensing signal applied via the first loop and the second sensing signal applied via the second loop.

5. The electrostatic force generator of claim 1, wherein a turns ratio between the two primary windings of the differential transformer is one, and a turns ratio from the secondary winding to one of the primary windings is equal to or greater than one.

6. The electrostatic force generator of claim 1, wherein the PID controller is configured to generate a second AC signal in response to the output signal $V_x$, and to apply the second AC signal to the second capacitor to compensate the capacitive difference.

7. The electrostatic force generator of claim 6, wherein the PID controller is configured to generate the first AC signal and the second AC signal in response to the output signal $V_x$, and to apply the first AC signal and the second AC signal to the capacitive module via the first loop and the second loop, respectively, to compensate the capacitive difference.

8. The electrostatic force generator of claim 1, wherein the capacitive module includes a first electrode, a second electrode and a third electrode between the first electrode and the second electrode.

9. The electrostatic force generator of claim 6, wherein the PID controller generates a control signal ($v_c$), and wherein the PID controller synthesizes the first AC signal and the second AC signal in response to the control signal as defined below:

the first AC signal $(v_{a1})=(V_b+v_c) \sin \omega_a t$;
the second AC signal $(v_{a2})=(V_b-v_c) \sin \omega_a t$; wherein
$\omega_a=2\pi(f_a)$, $V_b$ is a constant; and $f_a$ is the actuation frequency ranging from approximately 100 Hz to 2 kHz.

10. A force measurement system, comprising:

the electrostatic force generator of claim 1, wherein the capacitive module includes a first electrode, a second electrode and a third electrode between the first electrode and the second electrode;

a monolithic flexure stage to which the third electrode is attached; and a base holding the capacitive module, wherein the capacitive module further includes a metal housing and an insulation plate, the metal housing accommodates the first electrode, the second electrode, the third electrode and the insulation plate, and the second electrode is disposed on the insulation plate.

11. The force measurement system of claim 10, further comprising an RF alternative current (AC) voltage source configured to generate an RF excitation signal to be coupled with the capacitive module.

12. The force measurement system of claim 11, wherein the capacitive module is configured to divide the RF excitation signal into a first sensing signal and a second sensing signal.

13. The force measurement system of claim 12, wherein the differential transformer is configured to generate the differential signal in response to the first sensing signal applied via the first loop and the second sensing signal applied via the second loop.

14. The force measurement system of claim 10, wherein a turns ratio between the two primary windings of the differential transformer is one, and a turns ratio from the secondary winding to one of the primary windings is equal to or greater than one.

15. The force measurement system of claim 10, wherein the PID controller is configured to generate a second AC signal in response to the output signal $V_x$, and to apply the second AC signal to the second capacitor to compensate the capacitive difference.

16. The force measurement system of claim 15, wherein the PID controller is configured to generate the first AC signal and the second AC signal in response to the output signal $V_x$, and to apply the first AC signal and the second AC signal to the capacitive module via the first loop and the second loop, respectively, to compensate the capacitive difference.

17. The force measurement system of claim 15, wherein the PID controller generates a control signal ($v_s$), and wherein the PID controller synthesizes the first AC signal and the second AC signal in response to the control signal as defined below:

the first AC signal $(v_{a1})=(V_b+v_c) \sin \omega_a t$;
the second AC signal $(v_{a2})=(V_b-v_c) \sin \omega_a t$; wherein
$\omega_a=2\pi(f_a)$, $V_b$ is a constant; and $f_a$ is the actuation frequency ranging from approximately 100 Hz to 2 kHz.

18. An accelerometer, comprising:

the electrostatic force generator of claim 1, wherein the capacitive module includes a first electrode, a second electrode and a third electrode between the first electrode and the second electrode;

a mechanical spring to which the third electrode is attached; and a housing having a top wall, a first lateral wall and a second lateral wall, wherein the mechanical spring connects to the top wall, the first electrode is attached to the first lateral wall, and the second electrode is attached to the second lateral wall.

19. The accelerometer of claim 18, further comprising an RF alternative current (AC) voltage source configured to generate an RF excitation signal to be coupled with the capacitive module.

20. The accelerometer of claim 19, wherein the capacitive module is configured to divide the RF excitation signal into a first sensing signal and a second sensing signal.

21. The accelerometer of claim 20, wherein the differential transformer is configured to generate the differential signal in response to the first sensing signal applied via the first loop to the differential transformer and the second sensing signal applied via the second loop to the differential transformer.

22. The accelerometer of claim 18, wherein a turns ratio between the two primary windings of the differential transformer is one, and a turns ratio from the secondary winding to one of the primary windings is equal to or greater than one.

23. The accelerometer of claim 18, wherein the PID controller is configured to generate a second AC signal in response to the output signal $V_x$, and to apply the second AC signal to the second capacitor to compensate the capacitive difference.

24. The accelerometer of claim 23, wherein the PID controller is configured to generate the first AC signal and the second AC signal in response to the output signal $V_x$, and to apply the first AC signal and the second AC signal to the capacitive module via the first loop and the second loop, respectively, to compensate the capacitive difference.

25. The accelerometer of claim 23, wherein the PID controller generates a control signal ($v_c$), and wherein the PID controller synthesizes the first AC signal and the second AC signal in response to the control signal as defined below:

the first AC signal $(v_{a1})=(V_b+v_c) \sin \omega_a t$;
the second AC signal $(v_{a2})=(V_b-v_c) \sin \omega_a t$; wherein
$\omega_a=2\pi(f_a)$, $V_b$ is a constant; and $f_a$ is the actuation frequency ranging from approximately 100 Hz to 2 kHz.

\* \* \* \* \*